United States Patent
Stockinger et al.

(10) Patent No.: US 11,004,843 B2
(45) Date of Patent: May 11, 2021

(54) SWITCH CONTROL CIRCUIT FOR A POWER SWITCH WITH ELECTROSTATIC DISCHARGE (ESD) PROTECTION

(71) Applicant: NXP USA, INC., Austin, TX (US)

(72) Inventors: Michael A. Stockinger, Austin, TX (US); Dale John Mcquirk, Austin, TX (US)

(73) Assignee: NXP USA, INC., Austin, TX (US)

(*) Notice: Subject to any disclaimer, the term of this patent is extended or adjusted under 35 U.S.C. 154(b) by 217 days.

(21) Appl. No.: 16/251,584

(22) Filed: Jan. 18, 2019

(65) Prior Publication Data

US 2020/0235089 A1    Jul. 23, 2020

(51) Int. Cl.
*H01L 27/02*    (2006.01)
*H02H 9/04*    (2006.01)

(52) U.S. Cl.
CPC ...... *H01L 27/0285* (2013.01); *H01L 27/0292* (2013.01); *H02H 9/046* (2013.01)

(58) Field of Classification Search
CPC ............. H01L 27/0248; H01L 27/0285; H01L 27/0292; H01L 27/0266; H05K 1/0259; H05K 9/0067; H02H 9/046
See application file for complete search history.

(56) References Cited

U.S. PATENT DOCUMENTS

| 8,218,275 | B2 | 7/2012 | Martin et al. |
| 8,786,990 | B2 | 7/2014 | Prabhu et al. |
| 2004/0027742 | A1* | 2/2004 | Miller ................. H01L 27/0251 361/52 |
| 2005/0078419 | A1* | 4/2005 | Stockinger .......... H01L 27/0251 361/56 |
| 2006/0028776 | A1* | 2/2006 | Stockinger .......... H01L 27/0255 361/56 |
| 2008/0049365 | A1* | 2/2008 | Worley ............... H01L 27/0285 361/56 |
| 2009/0067104 | A1* | 3/2009 | Stockinger .......... H01L 27/0251 361/56 |
| 2011/0267723 | A1* | 11/2011 | Stockinger .......... H01L 27/0285 361/56 |
| 2014/0139963 | A1* | 5/2014 | Stockinger ....... H03K 19/00315 361/111 |
| 2016/0248418 | A1 | 8/2016 | Chen et al. |

* cited by examiner

*Primary Examiner* — Alex Torres-Rivera

(57) ABSTRACT

An integrated circuit includes a power switch coupled between a first voltage supply node and an internal voltage supply node and a switch control circuit coupled to a control electrode of the power switch. The switch control circuit includes a driver circuit coupled between a second voltage supply node and a third voltage supply node, a pass-gate having a first node coupled to an output of the driver circuit and a second node coupled to the control electrode of the power switch, a pull-up transistor having a first current electrode coupled to the first voltage supply node, a second current electrode coupled to the control electrode of the power switch, and a bias circuit having a bias output configured to provide a higher voltage between the first and second power supply nodes as a bias voltage to a body electrode of the pull-up transistor.

14 Claims, 3 Drawing Sheets

SWITCH CONTROL CIRCUIT FOR A POWER SWITCH WITH ELECTROSTATIC DISCHARGE (ESD) PROTECTION

BACKGROUND

Field

This disclosure relates generally to integrated circuits, and more specifically, to a switch control circuit for a power switch with Electrostatic Discharge (ESD) protection.

Related Art

Microcontroller chips typically require low standby leakage to minimize power consumption in battery supplied applications. One current standby leakage current reduction technique uses a power switch between an external voltage supply pin and an internal core voltage supply net which allows the internal core circuitry of the microcontroller chip to be turned on and off by controlling the connection between the external supply pin and the internal core voltage supply net. If the power switch is turned off while an external voltage is present at the external voltage supply pin, the leakage through the power switch causes undesired power consumption. Therefore, the power switch needs to minimize off-state leakage.

In one solution, the power switch includes a thicker gate oxide than the internal core devices and is controlled by a separate voltage domain which is supplied by a higher external voltage supply pin which provides a higher supply voltage than the external voltage provided by the external voltage supply pin. This higher supply voltage is provided to a control electrode of the power switch to turn off the power switch, as needed, to disconnect the external voltage supply pin from the internal core voltage supply, as needed. In this manner, the power switch can be turned off in deep-subthreshold (i.e. with a gate bias below 0V).

This power switch also shields internal core circuitry from an ESD event occurring on the external voltage supply pin. Therefore, the power switch must be turned off during a positive ESD event on this pin. However, since the power switch is controlled by the higher supply voltage in the separate voltage domain, which would be un-powered during an ESD event, the power switch would actually turn on during the ESD event, exposing the core circuitry to the ESD stress which may damage the core circuitry. Therefore, a need exists for improved control of the power switch to protect against ESD events.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a power switch of a data processing system has a first current electrode coupled to an external supply pin, VDD, and a second current electrode coupled to an internal core supply net (VDD_INT) to selectively connect VDD_INT to VDD. In one embodiment, the power switch is implemented as a P-channel Metal Oxide Semiconductor Field Effect Transistor (referred to as a PMOS transistor). A switch control circuit, including a driver circuit, is coupled to a control electrode of the power switch and is supplied by VDD and a separate external voltage supply pin, VDD_CTL. During normal operation (in which the data processing system is powered up and no ESD stress event is occurring), the power switch is controlled by the driver circuit, powered by VDD_CTL, to selectively connect VDD to VDD_INT to power the internal core devices. The VDD voltage is lower than the VDD_CTL voltage (and, in one embodiment, the VDD_CTL voltage exceeds the safe operating voltage of the internal devices of the data processing system supplied by VDD_INT.) However, during an ESD event, VDD_CTL is unpowered and VDD therefore exceeds VDD_CTL. The control circuit is configured to actively turn off the power switch via a pull-up transistor during the ESD event. The control circuit includes a bias circuit coupled to both VDD_CTL and VDD and configured to provide the higher of the two voltages as a bias voltage. In one embodiment, the control electrode of the pull-up transistor is coupled to VDD_CTL, and in another embodiment, the control electrode of the pull-up transistor is coupled to the bias circuit via a resistor-capacitor (RC) filter. The control circuit also includes a pass gate coupled between the driver circuit and the power switch. During normal operation, the pass gate is on such that the output of the driver circuit controls the power switch, but during ESD events, the pass gate is turned off to isolate the power switch from the driver circuit.

Figure 1:
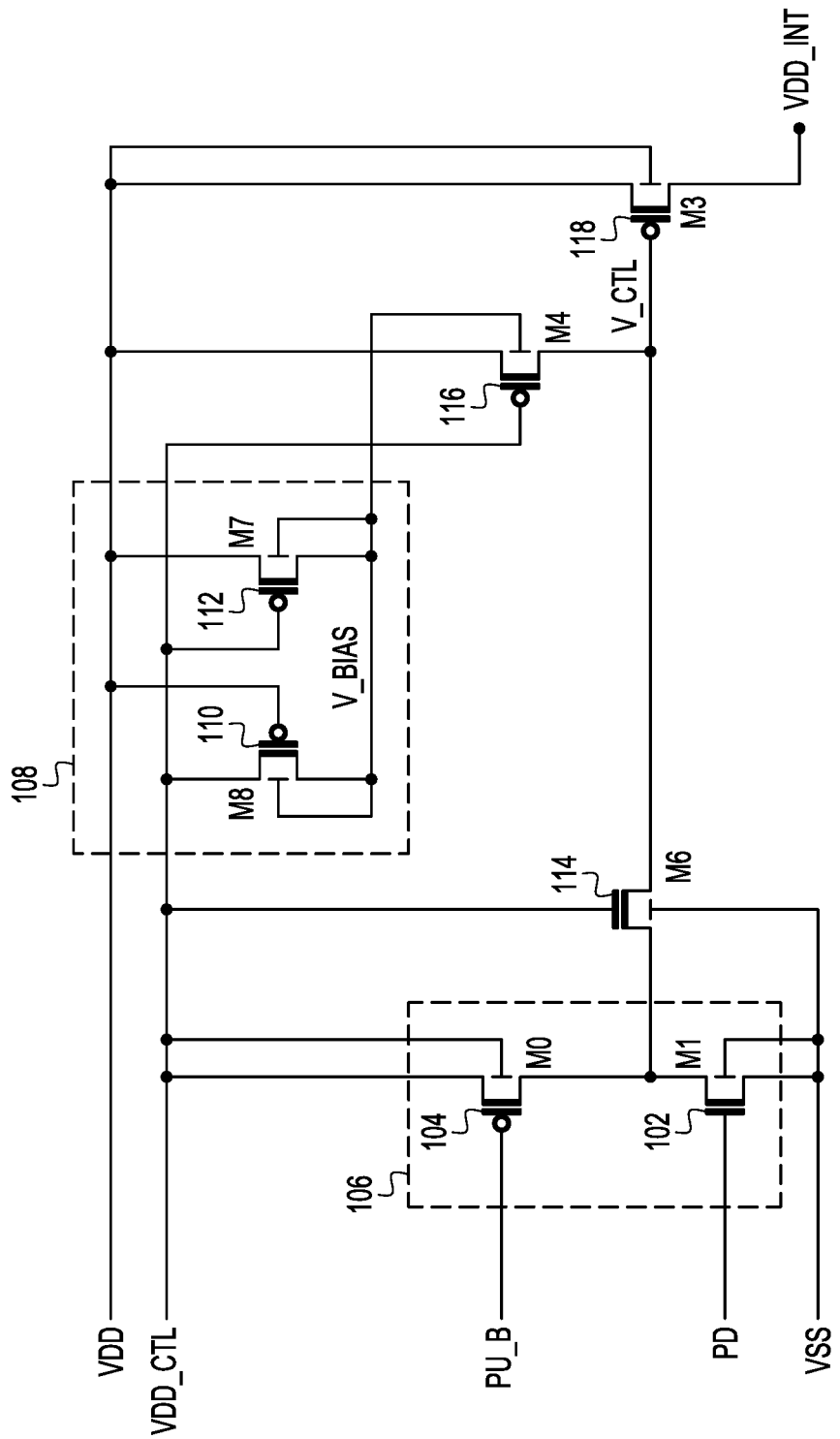
FIG. 1 illustrates, in schematic form, a power switch and switch control circuit coupled to a control electrode of the power switch, in accordance with one embodiment of the present invention.

FIG. 1 illustrates, in schematic form, an integrated circuit 100 having a power switch M3 118 and a switch control circuit coupled to a control electrode of the power switch, in accordance with one embodiment of the present invention. Integrated circuit 100 may be part of a data processing system, such as, for example, a microprocessor or microcontroller, in which VDD_INT is coupled to power the core of the data processing system. In the illustrated embodiment, the power switch M3 118 is implemented as a PMOS transistor. The switch control circuit includes a driver circuit 106 coupled between a first supply node, corresponding to VDD_CTL, and a second supply node, corresponding to VSS. The switch control circuit further includes a pass gate M6 114, implemented as an N-channel Metal Oxide Semiconductor Field Effect Transistor (referred to as an NMOS transistor), coupled between driver circuit 106 and a control electrode of power switch M3 118 (corresponding to a circuit node labeled V_CTL), a pull-up PMOS transistor M4 116 coupled between VDD and V_CTL, and a bias circuit 108 coupled to VDD and VDD_CTL and to pull-up transistor M4 116. Note that each transistor in FIGS. 1-3 has a corresponding reference numeral as well as an "M" label (e.g. M0-M11), and may each therefore be referred to interchangeably by the reference numeral or the M label.

Still referring to FIG. 1, driver circuit 106 includes a PMOS transistor M0 104 and an NMOS transistor M1 102. Transistor M0 has a first current electrode coupled to VDD_CTL, a control electrode coupled to receive the inverse of a pull-up signal, PU_B, a second current electrode coupled to provide an output of driver circuit 106, and a body electrode coupled to VDD_CTL. Note that a body electrode, as used herein, refers to the corresponding n-type well (nwell) or p-type well (pwell) in which the transistor is formed. Transistor M1 has a first current electrode coupled to the second current electrode of transistor M0, a control electrode coupled to receive a pull-down signal, PD, a second current electrode coupled to VSS, and a body electrode coupled to VSS. Driver 106 may include any number of stages, and as illustrated, is a last stage of a driver circuit whose output controls V_CTL via pass-gate M6 during normal operation. Note that the final stage of driver circuit 106 operates in the VDD_CTL power domain. In the embodiment of FIG. 1, pass-gate M6 is an NMOS transistor having a first current electrode coupled to the second current electrode of transistor M0 (the output of driver circuit 106), a control electrode coupled to VDD_CTL, a second current electrode coupled to V_CTL at the control electrode of power switch M3, and a body electrode coupled to VSS. Pass-gate 114 may therefore be described as having a first node (corresponding to the first current electrode of transistor M6) and a second node (corresponding to the second current electrode of transistor M6) and a control input (corresponding to the control electrode of transistor M6). When the control input is asserted, the first node is connected to the second node and when the control input is deasserted or negated, the first node and the second node are disconnected. Note that driver circuit 106 and pass-gate M6 provide for a transition from the VDD_CTL power domain to the VDD power domain. Pull-up transistor M4 has a first current electrode coupled to VDD, a control electrode coupled to VDD_CTL, a second current electrode coupled to V_CTL, and a body electrode coupled to an output, V_BIAS, of bias circuit 108.

Bias circuit 108 includes a PMOS transistor M8 110 and a PMOS transistor M7 112, and provides a bias voltage at circuit node V_BIAS. Transistor M8 has a first current electrode coupled to VDD_CTL, a control electrode coupled to VDD, a second current electrode coupled to V_BIAS, and a body electrode coupled to V_BIAS. Transistor M9 has a first current electrode coupled to VDD, a control electrode coupled to VDD_CTL, a second current electrode coupled to V_BIAS, and a body electrode coupled to V_BIAS. Bias circuit 108 is coupled to VDD and VDD_CTL and provides the higher of the two voltages as the bias voltage at V_BIAS, and may therefore me referred to as a "higher of two" circuit.

In operation, during normal operation, in which integrated circuit 100 is powered up and no ESD stress event is occurring, the VDD voltage is lower than the VDD_CTL voltage. For example, in one embodiment, the VDD voltage is 1.1V which is within the safe operating voltage for all the internal core devices supplied by VDD_INT, while the VDD_CTL voltage is 1.8V, which is outside the safe operating voltage for the internal core devices. In this situation, bias circuit 108 provides the VDD_CTL voltage as V_BIAS (due to transistor M8 being on and transistor M7 being off), and pull-up transistor M4 is fully turned off. Pass-gate transistor M6 is in the "on" state connecting the output of driver circuit 106 (corresponding to the circuit node between the second current electrode of transistor M0 and the first current electrode of transistor M1) to the V_CTL node at the control electrode of power switch M3. In this manner, during normal operation, driver circuit 106 continues to control power switch M3 without interference from pull-up transistor M4. Note that, during normal operation, the pull-up and pull-down control signals, PU_B and PD, of driver circuit 106 determine the logic state of V_CTL which controls power switch M3, as known in the art. For example, if PU_B and PD are both high (i.e. at the VDD_CTL potential), then V_CTL is at a logic level low, and vice versa.

During an ESD stress event on the VDD pin, VDD rises to a relatively high voltage. The primary ESD protection clamp (not shown) of the VDD pad may limit the VDD voltage to a high voltage (such as about 5V). Since the integrated circuit is unpowered during a component-level ESD stress event, VDD_CTL remains at a low potential. During the ESD stress event, pass-gate transistor M6, bias circuit 108, and pull-up transistor M4 ensure that power switch M3 is turned off. This is done through pull-up transistor M4 whose control electrode is directly tied to the VDD_CTL supply. During the ESD stress event, the VDD voltage exceeds the VDD_CTL voltage, and bias circuit 108 provides the VDD voltage as V_BIAS due to transistor M7 being on and transistor M8 being off. When the VDD voltage exceeds VDD_CTL by more than a threshold voltage (Vth) of pull-up transistor M4, pull-up transistor M4 is turned on, pulling the VDD_CTL node to VDD and turning off power switch M3. In this manner, power switch M3 is turned off whenever the VDD voltage exceeds the VDD_CTL voltage by more than a Vth of pull-up transistor M4, which would be the case during a positive ESD stress event on the VDD supply pin. With power switch M3 in the off state, the VDD_INT supply net is shielded from the external ESD stress. Pass-gate transistor M6 in the path between driver circuit 106 and V_CTL is off and thus prevents the control electrode of power switch M3 from getting pulled down to VDD_CTL via the parasitic drain-bulk diode of transistor M0 in driver circuit 106. Pass-gate transistor M6 remains off because its control electrode is tied to VDD_CTL and thus remains at a low potential.

In one embodiment, pass-gate transistor M6 is implemented using a natural NMOS transistor with a threshold voltage at or below 0V. A natural NMOS transistor may include a transistor whose body (the well in which the device is formed) is undoped (i.e. natural) or very lightly doped to result in a near zero threshold voltage. The use of a natural NMOS transistor ensures that the control path between the output of driver circuit 106 between M0 and M1 and the control electrode of power switch M3 is fully open, even as the V_CTL voltage reaches the VDD_CTL potential. However, in some implementations, a technology in which a natural NMOS transistor is not available, a regular NMOS transistor with a higher threshold voltage can be used. In this case, depending on the application, the NMOS transistor would need to be augmented by a PMOS transistor in parallel with the NMOS transistor so as to still ensure a low resistance of the pass-gate between driver circuit 106 and power switch M3, as illustrated in the embodiment of FIG. 2.

Figure 2:
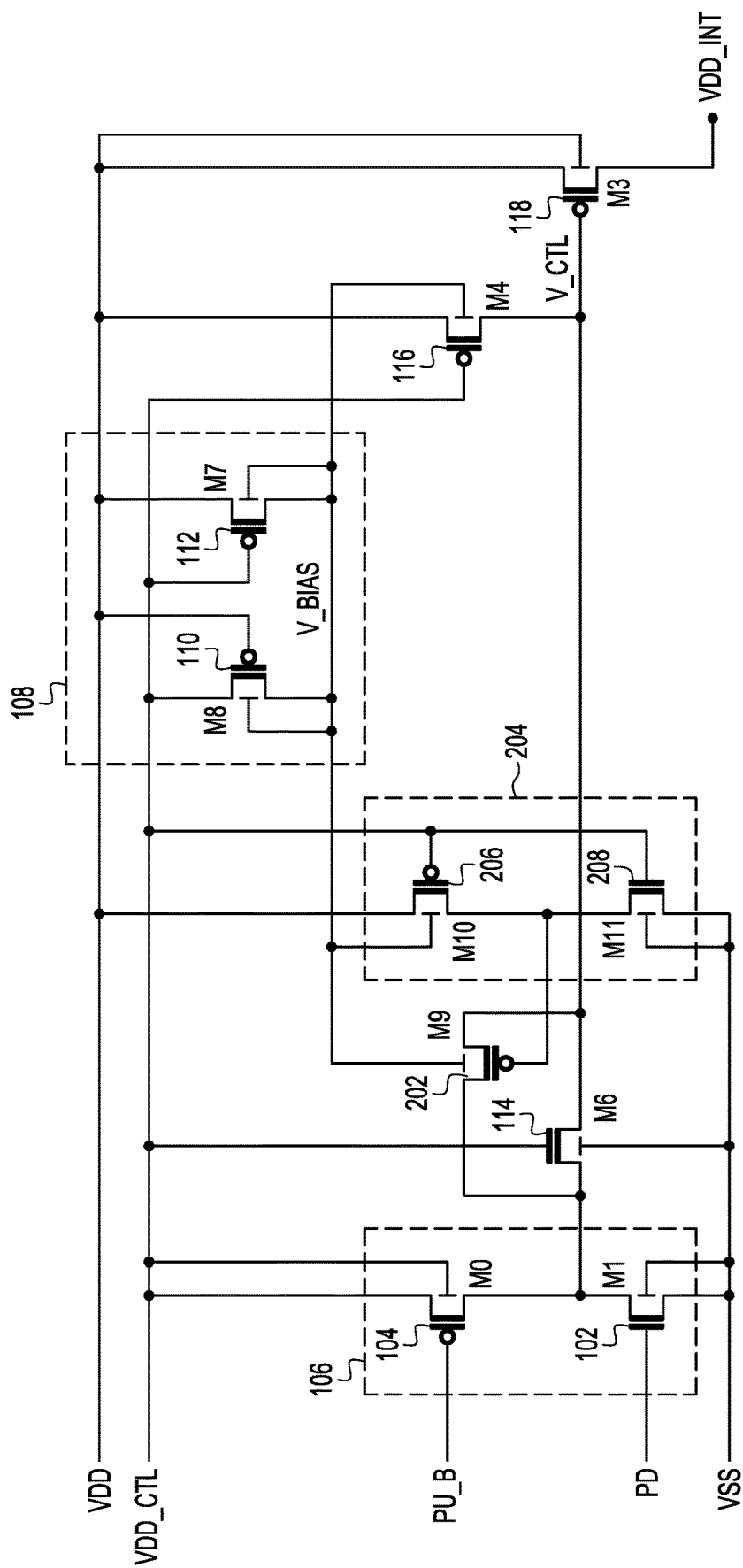
FIG. 2 illustrates, in schematic form, a power switch and switch control circuit coupled to a control electrode of the power switch, in accordance with another embodiment of the present invention.

FIG. 2 illustrates, in schematic form, an integrated circuit 200 having power switch M3 118 and a switch control circuit coupled to a control electrode of the power switch, similar to the switch control circuit of FIG. 1 but with an additional PMOS transistor M9 202 in parallel with transistor M6, in accordance with one embodiment of the present invention. Transistor M9 has a first current electrode coupled to the first current electrode of transistor M6, a second current electrode coupled to the second current electrode of transistor M6, and a control electrode and a body electrode coupled to V_BIAS. Transistor M9 may also be referred to as a pass-gate transistor, in which transistors M6 and M9 together form a pass-gate between the output of driver 106 (between M0 and M1) and the control electrode of transistor M3 to enhance the voltage range of the pass-gate as opposed to using just transistor M6 as in FIG. 1.

Referring to FIG. 2, integrated circuit 200 also includes a PMOS transistor M10 206 and NMOS transistor M11 208, which together form an inverter 204. Transistor M10 has a first current electrode coupled to VDD, a second control electrode coupled to the control electrode of transistor M9, a control electrode coupled to VDD_CTL, and a body electrode coupled to V_BIAS. Transistor M11 has a first current electrode coupled to the second current electrode of transistor M10, a control electrode coupled to VDD_CTL, a second current electrode coupled to VSS, and a body electrode coupled to VSS. In this embodiment, the first node of the pass-gate corresponds to the first current electrodes of both transistors M6 and M9, the second node of the pass-gate corresponds to the second current electrodes of both transistors M6 and M9. The control input of the pass-gate includes the control electrodes of transistors M6 and M9 in which the control electrode of transistor M6 receives VDD_CTL while the control electrode of transistor M9 receives the VSS voltage if VDD_CTL is powered up (for example, during normal chip operation) or the VDD voltage if VDD_CTL is unpowered (for example, during an ESD event). This is accomplished by inverter 204 formed by transistors M10 and M11. When the input to the control electrode of transistor M6 is asserted, the first and second node of the pass-gate are connected, and when the input to the control electrode of transistor M6 is deasserted or negated, the first node is disconnected from the second node. However, in the case in which the V_CTL potential is close to VDD_CTL, the first and second nodes are connected or disconnected based on whether transistor M9 is turned on or off, respectively.

In operation, the addition of transistor M9 in parallel with transistor M6 enhances the voltage range of the pass-gate. The control electrode of transistor M9 is controlled by the output of inverter 204. Transistor M10 of the inverter is configured similarly to pull-up transistor M4, meaning it will turn on and pull the control electrode of transistor M9 high whenever the VDD voltage exceeds the VDD_CTL voltage by more than a threshold voltage of transistor M10, which is what occurs during a positive ESD stress event on the VDD pin. During such an ESD stress event, pass-gate transistor M9 (like pass-gate transistor M6) is in the off state. During normal operation, transistor M9 would be turned on (like transistor M6) because transistor M11 would keep its control electrode at VSS. In order to minimize any potential DC current during a power ramp where the VDD voltage may be temporarily higher than the VDD_CTL voltage, transistor M11 can be implemented as a long/narrow channel device.

Figure 3:
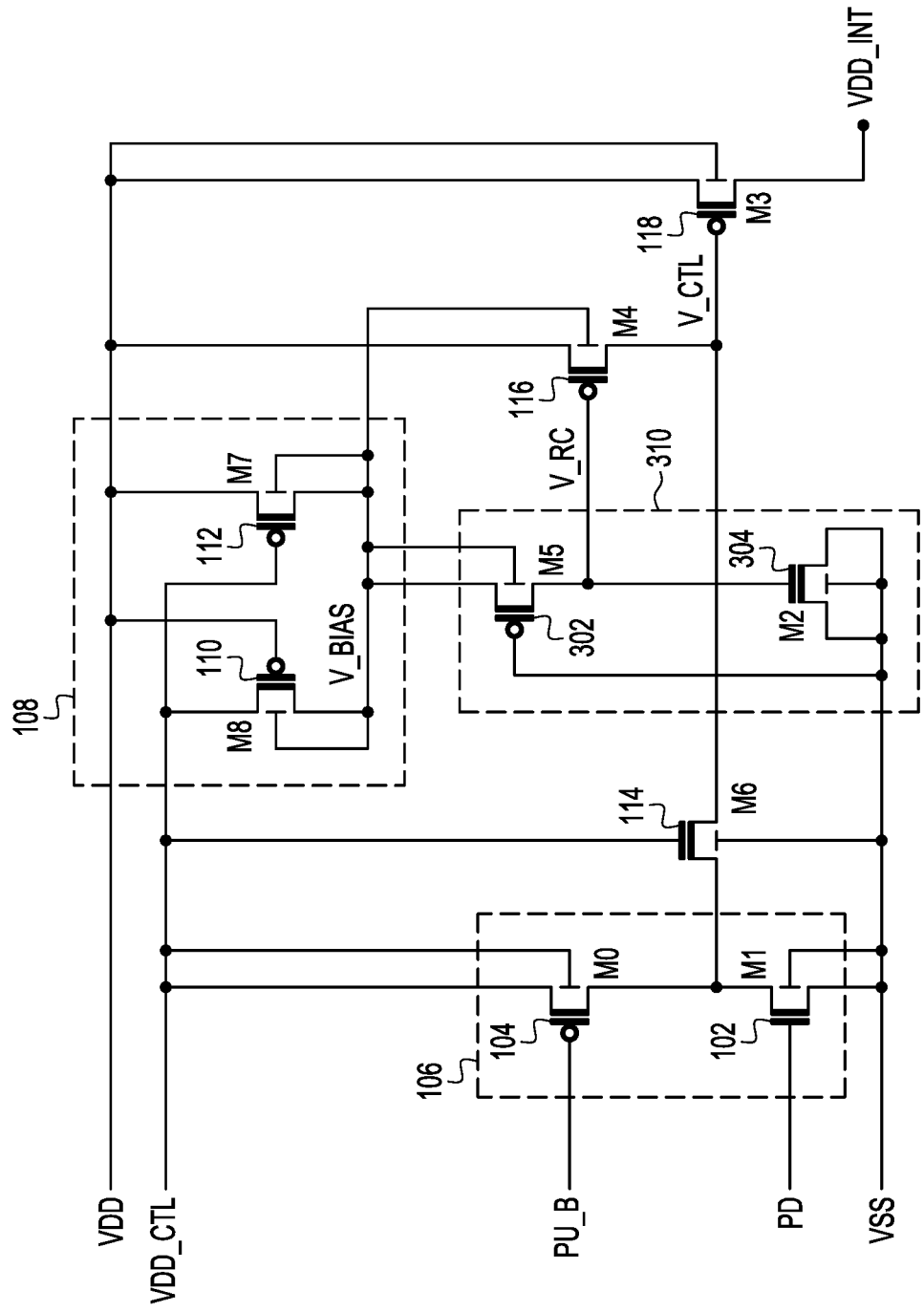
FIG. 3 illustrates, in schematic form, a power switch and switch control circuit coupled to a control electrode of the power switch, in accordance with another embodiment of the present invention.

FIG. 3 illustrates, in schematic form, an integrated circuit 300 having a power switch M3 118 and a switch control circuit coupled to a control electrode of the power switch, in accordance with one embodiment of the present invention. As with integrated circuit 100, integrated circuits 200 and 300 may be part of a data processing system, such as, for example, a microprocessor or microcontroller, in which VDD_INT is coupled to power the core of the data processing system. Integrated circuit 300 is similar to integrated circuit 100, but includes an Resistor-Capacitor (RC) circuit 310 coupled between V_BIAS and pull-up transistor M4.

Rather than directly connecting the control electrode of transistor M4 to VDD_CTL as in FIGS. 1 and 2, RC circuit 310 is coupled to the control electrode of transistor M4. RC circuit 310 includes a PMOS transistor M5 302 and an NMOS transistor M2 304. Transistor 302 has a first current electrode and body electrode coupled to V_BIAS, a control electrode coupled to VSS, and a second control electrode coupled to the control electrode of transistor M4, in which the second current electrode provides an output of RC circuit 310, at circuit node V_RC, which drives the control electrode of pull-up transistor M4. Transistor 304 includes a control electrode coupled to V_RC and a first current electrode, second current electrode, and a body electrode coupled to VSS. In one embodiment, transistor M5 is implemented as a long-channel PMOS device configured as a resistive element, and transistor M2 is configured as a capacitive element (and may therefore be referred to as capacitive element M2).

During normal operation, in which integrated circuit 300 is powered up and no ESD stress event is occurring, the VDD voltage is lower than the VDD_CTL voltage. For example, in one embodiment, as was described above, the VDD voltage is 1.1V which is within the safe operating voltage for all the internal core devices supplied by VDD_INT, while the VDD_CTL voltage is 1.8V, which is outside the safe operating voltage for the internal core devices. In this situation, bias circuit 108 provides the VDD_CTL voltage as V_BIAS. When in normal operation, capacitive element M2 is fully charged and the VDD_CTL voltage is provided as V_BIAS such that the V_RC node is at the VDD_CTL potential. Therefore, pull-up transistor M4 is fully turned off and pass-gate transistor M6 is in the on state, such that the output of driver circuit 106 between transistors M0 and M1 is provided to the control electrode of power switch M3. In this manner, driver circuit 106 controls power switch M3 without interference from pull-up transistor M4. Note that no power sequencing requirement is required in that VDD and VDD_CTL can be powered up or down independently due to the fact that there is no parasitic diode that would turn on. (This is also the case with integrated circuit 100. With respect to integrated circuit 200, though, due to the possible presence of a DC current through M10 and M11 if VDD powers up before VDD_CTL, VDD_CTL should be powered up before VDD.)

During a positive ESD stress event on the VDD pin, VDD rises to a relatively high voltage. The primary ESD protection clamp (not shown) of the VDD pad may limit the VDD voltage. Since the integrated circuit is unpowered during a component-level ESD stress-event, VDD_CTL remains at a low potential. Therefore, bias circuit 108 provides the VDD voltage as V_BIAS (due to transistor M7 being on and transistor M8 being off). Capacitive element M2 of RC circuit 310 is initially discharged with V_RC being at a low potential. This turns on pull-up transistor M4, which pulls up V_CTL to the VDD potential. This keeps power switch M3 in the off state and shields the VDD_INT supply net from the external ESD stress. Pass-gate transistor M6 in the path between driver circuit 106 and V_CTL is off and thus prevents the control electrode of power switch M3 from getting pulled down to VDD_CTL via the parasitic drain-bulk diode of transistor M0 in driver circuit 106. Pass-gate transistor M6 remains off because its control electrode is tied to VDD_CTL and thus remains at a low potential.

Note that in response to an ESD stress event, the V_RC eventually charges up to the VDD potential as well, but at that point, pull-up transistor M4 is no longer needed because the V_CTL node is kept at VDD by the relatively large gate capacitance of power switch M3. There is also no significant pull-down path from V_CTL to VSS during an ESD event. Therefore, the time constant of RC circuit 310 can be relatively short (around 25 nanoseconds, for example). This allows for a relatively compact layout area for RC circuit 310 as compared to what is typically used for primary ESD RC clamps because the pull-up action on V_CTL in FIG. 3 does not need to last for the entire ESD event, which could be up to a few hundred nanoseconds.

In one embodiment, power switch M3 and the transistors of the switch control circuit have a thicker gate oxide than those transistors internal to the core and powered by VDD_INT. Therefore, the power switch and the devices of the switch control circuit can safely tolerate VDD_CTL, while those devices internal to the core and powered by VDD_INT cannot. Also, in an alternate embodiment, note that additional pass-gate transistor M9 and the invertor formed by M10 and M11 may also be used in the embodiment of FIG. 3, such as when no natural NMOS transistor is available.

Therefore, it can now be appreciated that a switch control circuit for a power switch is provided which is configured to actively turn off the power switch via a pull-up transistor during an ESD stress event while not interfering with the intended operation of the power switch during normal operation. The switch control circuit includes a driver circuit coupled via a pass gate to a control electrode of the power switch. During normal operation (in which the data processing system is powered up and no ESD event is occurring), the pass gate is turned on such that the power switch is controlled by the driver circuit, powered by VDD_CTL, to selectively connect VDD to VDD_INT. The VDD voltage is lower than the VDD_CTL voltage, in which the VDD_CTL voltage may exceed the safe operating voltage of the internal devices of the data processing system supplied by VDD_INT. However, during an ESD event, VDD_CTL is unpowered and VDD therefore exceeds VDD_CTL. The control circuit is configured to turn off the power switch via the pull-up transistor during the ESD event. The control circuit includes a bias circuit coupled to both VDD_CTL and VDD and configured to provide the higher of the two voltages as a bias voltage. In one embodiment, the control electrode of the pull-up transistor is coupled to VDD_CTL, and in another embodiment, the control electrode of the pull-up transistor is coupled to the bias circuit via a resistor-capacitor (RC) filter. During ESD events, the pass gate is turned off to isolate the power switch from the driver circuit. In this manner, through the use of the switch control circuit, improved protection against ESD events can be achieved without negatively impacting performance during normal operation.

The semiconductor substrate of the integrated circuits described herein can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name, an asterix (*) following the name, or a "B" following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of integrated circuits 100, 200, and 300 are circuitry located on a single integrated circuit or within a same device or chip. The integrated circuits may be used as part of any type of data processing system. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different circuit configurations can be used to select the bias voltage at V_BIAS, and different circuit configurations can also be used for the driver circuit and pass-gate. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a power switch coupled between a first voltage supply node and an internal voltage supply node; and a switch control circuit coupled to a control electrode of the power switch, wherein the switch control circuit includes a driver circuit coupled between a second voltage supply node and a third voltage supply node; a pass-gate having a first node coupled to an output of the driver circuit, a second node coupled to the control electrode of the power switch, and a control input; a pull-up transistor having a first current electrode coupled to the first voltage supply node, a second current electrode coupled to the control electrode of the power switch, and a control electrode; and a bias circuit coupled to each of the first and second voltage supply nodes and having a bias output configured to provide a higher voltage between the first and the second voltage supply nodes as a bias voltage to a body electrode of the pull-up transistor. In one aspect of this embodiment, the control electrode of the pull-up transistor is directly connected to the second voltage supply node. In a further aspect, the pass-gate includes a first NMOS transistor having a first current electrode coupled to the first node of the pass-gate and a second current electrode coupled to the second node of the pass-gate, and a control electrode coupled to the second voltage supply node. In yet a further aspect, the NMOS transistor is implemented as a natural NMOS transistor. In another further aspect, the switch control circuit further includes an inverter having an input coupled to the second voltage supply node, and wherein the pass-gate includes a first PMOS transistor having a first current electrode coupled to the first node of the pass-gate and a second current electrode coupled to the second node of the pass-gate, and a control electrode coupled to receive a voltage of the first voltage supply if a voltage level of the second voltage supply is less than a voltage level of the first voltage supply. In another aspect of this embodiment, the bias circuit includes a first PMOS transistor having a first current electrode coupled to the second voltage supply node, a second current electrode coupled to the bias output, and a control electrode coupled to the first voltage supply node, and a second PMOS transistor having a first current electrode coupled to the first voltage supply node, a second current electrode coupled to the bias output, and a control electrode coupled to the second voltage supply node. In yet another aspect of this embodiment, the pull-up transistor includes a PMOS transistor. In another aspect, the switch control circuit further includes a resistor-capacitor (RC) circuit coupled between the bias output and the third voltage supply node, and having an output coupled to the control electrode of the pull-up transistor. In a further aspect, the RC circuit includes a first PMOS transistor having a first current electrode and a body electrode coupled to the bias output, a second current electrode coupled to the control electrode of the pull-up transistor, and a control electrode coupled to the third power supply node; and a capacitive element coupled between the control electrode of the pull-up transistor and the third power voltage supply node. In yet a further aspect, the capacitive element is implemented with an NMOS transistor.

In another embodiment, an integrated circuit includes a power switch coupled between a first voltage supply node and an internal voltage supply node; and a switch control circuit coupled to a control electrode of the power switch and configured to operate during normal operation and during an electrostatic discharge (ESD) event, wherein the switch control circuit includes a driver circuit coupled between a second voltage supply node and a third voltage supply node and configured to selectively connect the first voltage supply node to the internal supply node during normal operation by driving the control electrode of the power switch; a pass-gate configured to connect an output of the driver circuit to the control electrode of the power switch during normal operation and isolate the output of the driver circuit from the control electrode of the power switch during the ESD event; a pull-up transistor coupled between the first voltage supply node and the control electrode of the power switch and configured to turn on and pull up the control electrode of the power switch during the ESD event and to turn off during normal operation; and a bias circuit coupled to each of the first and second voltage supply nodes and having a bias output configured to provide a higher voltage between the first and the second voltage supply nodes as a bias voltage to a body electrode of the pull-up transistor. In one aspect of this another embodiment, the bias circuit includes a first PMOS transistor having a first current electrode coupled to the second voltage supply node, a second current electrode coupled to the bias output, and a control electrode coupled to the first voltage supply node, and a second PMOS transistor having a first current electrode coupled to the first voltage supply node, a second current electrode coupled to the bias output, and a control electrode coupled to the second voltage supply node. In another aspect, the pull-up transistor includes a PMOS transistor. In yet another aspect, the switch control circuit further includes a resistor-capacitor (RC) circuit coupled between the bias output and the third voltage supply node, and having an output coupled to the control electrode of the pull-up transistor. In a further aspect, the RC circuit includes a first PMOS transistor having a first current electrode coupled to the bi as output, a second current electrode coupled to the control electrode of the pull-up transistor, and a control electrode coupled to the third power supply node; and a capacitive element coupled between the control electrode of the pull-up transistor and the third power supply node. In yet a further aspect, during the ESD event, the capacitive element is configured to be initially discharged so as to turn on the pull-up transistor to pull-up the control electrode of the power switch towards a voltage potential at the first voltage supply node.

In yet another embodiment, an integrated circuit includes a PMOS transistor power switch having a first current electrode coupled to a first voltage supply node, a second current electrode coupled to an internal voltage supply node, and a control electrode; a switch control circuit coupled to the control electrode of the PMOS transistor power switch, wherein the switch control circuit includes a driver circuit coupled between a second voltage supply node and a third voltage supply node; a pass-gate having a first node coupled to an output of the driver circuit, a second node coupled to the control electrode of the PMOS transistor power switch, and a control input; a pull-up transistor having a first current electrode coupled to the first voltage supply node, a second current electrode coupled to the control electrode of the PMOS transistor power switch, and a control electrode; a bias circuit coupled to each of the first and second voltage supply nodes and having a bias output configured to provide a higher voltage between the first and the second voltage supply nodes as a bias voltage to a body electrode of the pull-up transistor; and a resistor-capacitor (RC) circuit having a resistive element coupled between the bias output and the control electrode of the PMOS transistor power switch and a capacitive element coupled between the control electrode of the PMOS transistor power switch and the third voltage supply node. In one aspect of this yet another embodiment, the switch control circuit operates during normal operation and an electrostatic discharge (ESD) event, wherein the driver circuit is configured to selectively connect the first voltage supply node to the internal supply node during normal operation by driving the control electrode of the PMOS transistor power switch, and the pass-gate is configured to connect an output of the driver circuit to the control electrode of the PMOS transistor power switch during normal operation and isolate the output of the driver circuit from the control electrode of the PMOS transistor power switch during the ESD event. In a further aspect, the pull-up transistor is configured to turn on and pull up the control electrode of the PMOS transistor power switch during the ESD event and to turn off during normal operation. In yet a further aspect, during the ESD event, the capacitive element is configured to be initially discharged so as to turn on the pull-up transistor to pull-up the control electrode of the PMOS transistor power switch towards a voltage potential at the first voltage supply node.

What is claimed is:

1. An integrated circuit comprising:
   a power switch coupled between a first voltage supply node and an internal voltage supply node; and
   a switch control circuit coupled to a control electrode of the power switch, wherein the switch control circuit includes:
      a driver circuit coupled between a second voltage supply node and a third voltage supply node;
      a pass-gate having a first node coupled to an output of the driver circuit, a second node coupled to the control electrode of the power switch, and a control input;
      a pull-up transistor having a first current electrode coupled to the first voltage supply node, a second current electrode coupled to the control electrode of the power switch, and a control electrode; and
      a bias circuit coupled to each of the first and second voltage supply nodes and having a bias output configured to provide a higher voltage between the first and the second voltage supply nodes as a bias voltage to a body electrode of the pull-up transistor.

2. The integrated circuit of claim 1, wherein the control electrode of the pull-up transistor is directly connected to the second voltage supply node.

3. The integrated circuit of claim 1, wherein the pass-gate includes:
   a first NMOS transistor having a first current electrode coupled to the first node of the pass-gate and a second current electrode coupled to the second node of the pass-gate, and a control electrode coupled to the second voltage supply node.

4. The integrated circuit of claim 3 wherein the first NMOS transistor is implemented as a natural NMOS transistor.

5. The integrated circuit of claim 3, wherein the switch control circuit further includes an inverter having an input coupled to the second voltage supply node, and wherein the pass-gate includes:
   a first PMOS transistor having a first current electrode coupled to the first node of the pass-gate and a second current electrode coupled to the second node of the pass-gate, and a control electrode coupled to receive a voltage of the first voltage supply if a voltage level of the second voltage supply is less than a voltage level of the first voltage supply.

6. The integrated circuit of claim 1, wherein the bias circuit includes:
   a first PMOS transistor having a first current electrode coupled to the second voltage supply node, a second current electrode coupled to the bias output, and a control electrode coupled to the first voltage supply node, and
   a second PMOS transistor having a first current electrode coupled to the first voltage supply node, a second current electrode coupled to the bias output, and a control electrode coupled to the second voltage supply node.

7. The integrated circuit of claim 1, wherein the pull-up transistor comprises a PMOS transistor.

8. The integrated circuit of claim 1, wherein the switch control circuit further includes:
   a resistor-capacitor (RC) circuit coupled between the bias output and the third voltage supply node, and having an output coupled to the control electrode of the pull-up transistor.

9. The integrated circuit of claim 8, wherein the RC circuit comprises:
   a first PMOS transistor having a first current electrode and a body electrode coupled to the bias output, a second current electrode coupled to the control electrode of the pull-up transistor, and a control electrode coupled to the third power supply node; and
   a capacitive element coupled between the control electrode of the pull-up transistor and the third power voltage supply node.

10. The integrated circuit of claim 9, wherein the capacitive element is implemented with an NMOS transistor.

11. An integrated circuit comprising:
    a PMOS transistor power switch having a first current electrode coupled to a first voltage supply node, a second current electrode coupled to an internal voltage supply node, and a control electrode;
    a switch control circuit coupled to the control electrode of the PMOS transistor power switch, wherein the switch control circuit includes:
       a driver circuit coupled between a second voltage supply node and a third voltage supply node;
       a pass-gate having a first node coupled to an output of the driver circuit, a second node coupled to the control electrode of the PMOS transistor power switch, and a control input;
       a pull-up transistor having a first current electrode coupled to the first voltage supply node, a second current electrode coupled to the control electrode of the PMOS transistor power switch, and a control electrode;
       a bias circuit coupled to each of the first and second voltage supply nodes and having a bias output configured to provide a higher voltage between the first and the second voltage supply nodes as a bias voltage to a body electrode of the pull-up transistor; and a resistor-capacitor (RC) circuit having a resistive element coupled between the bias output and the control electrode of the pull-up transistor and a capacitive element coupled between the control electrode of the pull-up transistor and the third voltage supply node.

12. The integrated circuit of claim 11, wherein the switch control circuit operates during normal operation and an electrostatic discharge (ESD) event, wherein:

the driver circuit is configured to selectively connect the first voltage supply node to the internal supply node during normal operation by driving the control electrode of the PMOS transistor power switch, and the pass-gate is configured to connect an output of the driver circuit to the control electrode of the PMOS transistor power switch during normal operation and isolate the output of the driver circuit from the control electrode of the PMOS transistor power switch during the ESD event.

13. The integrated circuit of claim 12, wherein the pull-up transistor is configured to turn on and pull up the control electrode of the PMOS transistor power switch during the ESD event and to turn off during normal operation.

14. The integrated circuit of claim 13, wherein, during the ESD event, the capacitive element is configured to be initially discharged so as to turn on the pull-up transistor to pull-up the control electrode of the PMOS transistor power switch towards a voltage potential at the first voltage supply node.

* * * * *